Nov. 1, 1960 C. F. BOOHER II 2,958,515

HEAT DISSIPATING DEVICE FOR ELECTRICAL COMPONENTS

Filed Feb. 3, 1958 2 Sheets-Sheet 1

INVENTOR.
CHARLES F. BOOHER II

BY R. E. Geauque

Attorney

INVENTOR.
CHARLES F. BOOHER II
BY
R. E. Geauque
Attorney

United States Patent Office 2,958,515

Patented Nov. 1, 1960

2,958,515

HEAT DISSIPATING DEVICE FOR ELECTRICAL COMPONENTS

Charles F. Booher II, San Marino, Calif., assignor to The Birtcher Corporation, Los Angeles, Calif., a corporation of California Filed Feb. 3, 1958, Ser. No. 712,985

17 Claims. (Cl. 257—263)

This invention relates to a device for dissipating heat from electrical components and more particularly to a device for dissipating heat generated by components, such as transistors and diodes.

Transistors and diodes can be provided with a threaded post attached to the base of the component and can be secured to a chassis or metal plate by inserting the post through the metal plate so that the base rests upon the metal plate. In such a mounting, the heat must be dissipated from the small base area of the component by conduction to the metal plate or chassis. Also, in some instances, it is necessary to electrically insulate the base of the component from the mounting plate and this is accomplished by placing an insulating washer, such as a mica washer, between the base and the mounting plate. As is apparent, the presence of the insulating washer substantially reduces the heat dissipation from the base to the metal plate since the washer has low thermal conductivity and presents a thermal barrier. Since the rating of semi-conductors and other similar electrical components is limited by temperature, it is desirable to obtain more efficient heat dissipation from such devices.

The present invention provides for more efficient heat dissipation by utilizing a heat conducting structure having a base portion which is positioned against the base of the component and having a heat dissipating portion which extends away from the component and carries radiating fins. The conducting structure is constructed of a material, such as soft copper, silver or aluminum, having good heat conduction properties so that heat is conducted from the base of the component to the radiating fins and is dissipated from the conducting structure by radiation and convection. Heat conduction can also take place through the base portion of the structure to the mounting plate as in prior installations in order to assist in cooling the components, but the cooling of the component is not dependent upon conduction to the mounting plate. The heat dissipating portion preferably extends outwardly from the mounting plate to surround the component and a single conducting structure can be of various shapes and can dissipate heat from one or more electrical components.

It is therefore an object of the present invention to provide a heat dissipating device having a base portion in contact with an electrical component and a heat dissipating portion extending away from the component.

Another object of the invention is to provide a heat dissipating device having a portion in contact with an electrical component such as a semi-conductor, to remove heat by conduction and having another portion with radiating fins for dissipating heat removed from the electrical component.

A further object of the invention is to provide a device for dissipating heat from electrical components independently of heat conduction to the chassis or mounting plate for the components.

These, and other objects of the invention not specifically set forth above, will become readily apparent from the accompanying description and drawings in which.

Figure 1:
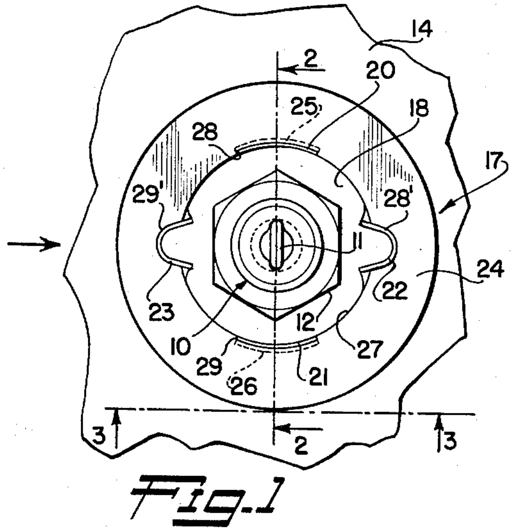
Figure 1 is a top plan view of an embodiment of the invention showing the fins located around a transistor.
Figure 2:
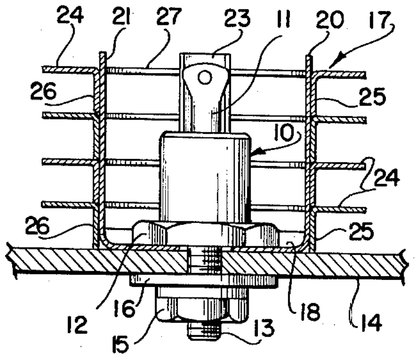
Figure 2 is a vertical section along line 2—2 of Figure 1 illustrating the supports for the fins.
Figure 3:
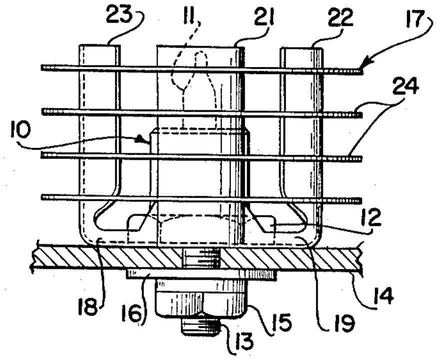
Figure 3 is a side elevational view of the device illustrated in Figure 1 and showing the base portion in contact with the mounting plate.

Referring to the embodiment shown in Figures 1–3 the electrical component comprises a transistor 10 having a terminal post 11 and a base 12 in the form of a hexagonal nut. A threaded post 13 extends from the base 12 through an opening in mounting plate 14 and the transistor is secured to the mounting plate by nut 15, threaded to post 13 and separated from the plate by washer 16. The heat dissipating device 17 has a circular base portion 18 which is clamped between base 12 and plate 14 and has a bent up rim 19. Two substantially flat supports 20, 21 extend upwardly from opposite edge portions of the rim 19. Also, two curved supports 22, 23 are spaced from supports 20, 21 and extend upward from opposite edge portions of rim 19.

A plurality of circular radiating fins 24 surrounds the supports 20, 21 and 22, 23 and each fin has a pair of downwardly extending legs 25 and 26 which are adjacent supports 20 and 21, respectively, and are of substantially the same circumferential width as the supports. The inner edge 27 of each fin can be offset outwardly where it connects with each leg 25, 26 to provide cut-out portions 28 and 29 for receiving the supports. Also, each fin has arc shaped, cut out portions 28' and 29' at the inner edge 27 for receiving a portion of supports 22 and 23, respectively. The legs 25 and 26 serve as spacers for spacing the fins 24 from one another and for spacing the bottom fin upwardly from the base portion 18. Each leg is brazed to its adjacent support and each fin is also brazed to both curved supports 22, 23 in order to firmly secure the fins. The cut-out portions at the inner edge 27 of each fin serve to retain the fins in place during the brazing operation.

Since the base portion 18 of heat dissipating device 17 is held against the base 12 of the component, heat is conducted from the component to the upright supports 20—23 and to the fins 24 secured to the supports. Heat is then dissipated from the supports and the fins by radiation and convection. When a cooling medium, such as air, is circulated across the component, the device 17 is positioned so that the direction of air flow is toward one of the curved supports 22, 23 and substantially parallel with the supports 20, 21. In Figure 1, the direction of air flow is indicated by the arrow and the curved support 23 presents a low drag shape to the air stream. Also, since only the edges of supports 20 and 21 are presented to the air stream and the support 22 is shielded from the air stream by the component, minimum drag results from these elements. As illustrated in Figure 2, heat conduction can also take place from the base portion 18 to the metal plate 14. The device 17 is constructed from metals, such as soft copper, silver or aluminum, having high heat conductivity, to insure maximum heat dissipation. It is understood that the center opening in the fins can be of any selected size except that it must be large enough to permit insertion of the component through the fins and into proximity with the mounting plate. The base portion 18 can be secured, such as by brazing or cementing, directly to the base 12 of the component in installations in which a mounting structure is not available. Also, the number, spacing and width of the fin can be varied as desired.

Figure 4:
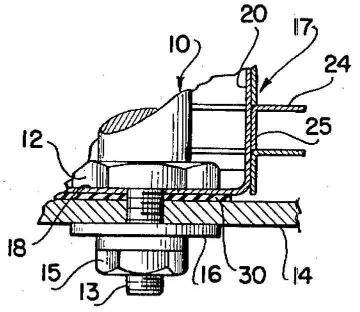
Figure 4 is a partial section similar to Figure 2 and showing the base portion separated from the mounting plate by an insulating washer.

Referring to Figure 4, wherein like reference numerals designate like parts, the base portion 18 is separated from metal plate 14 by a washer 30 of electrical insulating material, such as mica or a suitable ceramic. The washer 30 presents a thermal barrier to heat conduction from the base 12 to the plate 14 but does not affect the heat dissipation of the device 17. Thus, the electrical component is cooled mainly by device 17 although some heat may be conducted through washer 30 to plate 14. The washer 30 can be secured to or deposited on the base portion 18 so that it becomes an integral part of device 17.

Figure 5:
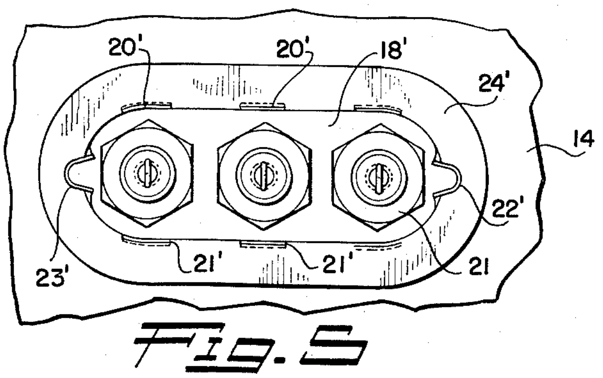
Figure 5 is a top plan view, similar to Figure 1, of a second embodiment of the invention showing a plurality of components associated with a single heat dissipating device.

Referring to the modification shown in Figure 5, the device 17′ is similar in construction to the one previously described except that the central opening is large enough to receive a plurality of components 10. The base portion 18′ has a separate opening for the post 13 of each component and can be positioned in contact with base 14 or can be separated therefrom by an insulating washer 30. A plurality of supports 20′ and 21′, similar in construction to supports 20, 21, can be located along the length of the components and supports 22′, 23′, similar in construction to supports 22, 23, are located at the opposite end of the components. A plurality of fins 24′ of oblong shape are secured to the supports for dissipating heat conducted by base portion 18′ from the components.

Figure 6:
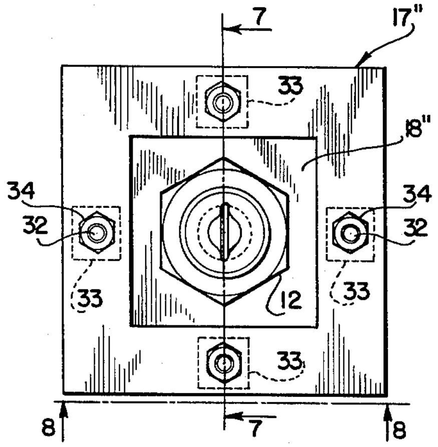
Figure 6 is a top plan view of another embodiment of the invention in which the fins are separated by spacers.
Figure 7:
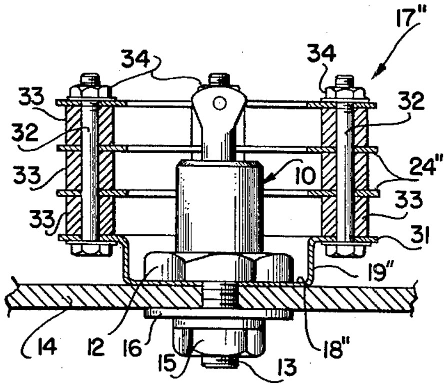
Figure 7 is a vertical section along line 7—7 of Figure 6 illustrating the bolts for securing the fins to the base portion.
Figure 8:
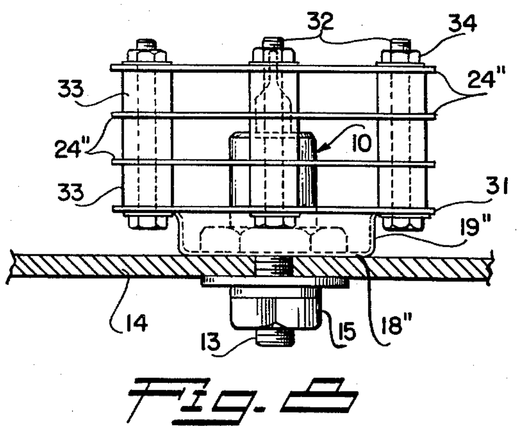
Figure 8 is a side elevational view of the device illustrated in Figure 6.

Referring to the modification shown in Figures 6–8, wherein like reference numerals designate like parts, the heat dissipating device 17″ comprises a square base portion 18″ having a rim 19″, and a square flange 31 extends outwardly from the edge of the rim to form one of the radiating fins and to form a support for additional radiating fins 24″. As in the form of the invention illustrated in Figures 1–3, the base portion 18″ is held between the base 12 and mounting plate 14 by nut 15 which is threaded to post 13, extending through openings in the base portion and mounting plate. It is understood that the base portion 18″ can be separated from mounting plate 14 by an insulating washer in the manner illustrated in Figure 4.

Each side of flange 31 contains an opening to receive an upright bolt 32. Four small, square spacers 33, each having an opening for one of the bolts 32, are located adjacent rim 31 and serve to separate the rim 31 from one of the square fins 24″. Also, four additional spacers 33 serve to separate each of the fins 24″ from adjacent fins. Since each fin also has four openings for the bolts 32, the bolts can extend through rim 31, spacers 33 and the fins in order to support the fins in spaced relationship. The nuts 34 for the bolts 32 tightly engage the outer fin 24″ in order to secure the spacers and fins to rim 31. It is understood that fins 24″, rim 31 and base portion 18″ can be of any suitable size and shape, such as circular, rectangular, etc., in order to receive one or more electrical components of various sizes and shapes. Also, the number of fins 24″ and the spacing between the fins can be easily varied as desired and the bolts 32 can be replaced with other suitable attachments, such as rivets. The spacers 32 are constructed of material having high heat conductivity and can be shaped to provide minimum resistance to air flow through the device 17″. In general, the device 17″ operates to cool the component 10 in the same manner as device 17.

It is therefore apparent that the heat dissipating device of the present invention can be constructed to receive one or more components of various shapes and sizes and that the device does not rely upon the mounting structure of the components as the heat sink. While flat fins are illustrated, various other fin shapes and arrangements can be utilized, such as a spiral configuration for the fins or corrugated surfaces for the fins. In general, the device can be attached to any desired part of components of various shapes by suitable attachments. Various other modifications are contemplated by those skilled in the art without departing from the spirit and scope of the invention as hereinafter defined by the appended claims.

What is claimed is:

1. A heat dissipating device for electrical circuit means comprising a portion held in contact with said circuit means, support means secured to and extending from said portion, and a plurality of fin means carried by said support means to dissipate heat generated by said circuit means, said fin means being spaced apart in the extending direction of said support means to provide passages between said fin means for circulation of a cooling medium over said circuit means.

2. A heat dissipating device as defined in claim 1 wherein said support means extend along the length of said circuit means and each of said fin means surround said circuit means.

3. A heat dissipating device for electrical components comprising a portion held in contact with a surface of said component, a plurality of spaced support members extending from said portion along said component to define a single space for said component, and a plurality of fins positioned by said support members and extending around said space to dissipate heat conducted from said component by said portion, said fins being spaced apart in the extending direction of said support members to provide a passage between adjacent fins.

4. A heat dissipating device as defined in claim 3 wherein said support members are straight and extend parallel with an axis of said component, each of said fins having an opening and said fins being separately supported in spaced relationship from one another along said support members, the inner edges of said openings surrounding the space for said component.

5. A heat dissipating device as defined in claim 3 wherein each of said fins have spacer means extending along at least one of said support members and secured thereto, said spacer means of each fin extending around only a portion of said space and engaging an adjacent fin to space the fins apart along said support members.

6. A heat dissipating device as defined in claim 3 wherein each of said fins contains a plurality of openings to receive said support members, and a plurality of spacers having openings therein to receive said support members and being located between adjacent fins.

7. A heat dissipating device for an electrical component having a flat end surface comprising a base portion held in contact with said end surface and extending outwardly from said end surface, a plurality of spaced support members extending along said component from the edge of said base portion to define a space for said component, and a plurality of fin means positioned by said support members and surrounding said space for dissipating heat generated by said component, said fin means being spaced apart in the extending direction of said support members to provide a passage between adjacent fin means.

8. A heat dissipating device as defined in claim 7 having a layer of electrical insulating material secured to said base portion on the opposite side from said end surface.

9. A heat dissipating device for an electrical component as defined in claim 7 wherein said support members comprise four equally spaced support members located in opposed pairs, the support members of one said pair being curved and the support members of the other said pair being substantially flat, said fin means comprising a plurality of metal fins surrounding said support members and having legs positioned along said substantially flat support members for spacing said fins from one another.

10. A heat dissipating device as defined in claim 9 wherein said base portion is circular in shape, each of said fins being a flat circular ring having an inner diameter substantially the same as the outer diameter of said base portion.

11. A heat dissipating device for an electrical component comprising a portion held in contact with a surface of said component, four equally spaced support members located in opposed pairs and extending from said portion along said component to define a space for said component, and fin means secured to said support members and surrounding said component, one pair of said support members being curved outwardly to provide low drag to the flow of cooling fluid in the direction of said component and the other pair of said support members being substantially flat to present the edges thereof to the flow of cooling fluid in such direction.

12. An installation for an electrical component comprising a mounting plate having an opening therein, a post extending from one end surface of said component and secured within said opening, heat dissipating means having a base portion positioned between said end surface and said mounting plate and extending outwardly beyond said end surface, a plurality of spaced support members extending along said component from the edge of said base portion, and a plurality of fin means carried by said support means in spaced apart relationship to provide passages therebetween, each fin means surrounding said component for dissipating heat generated by said component.

13. An installation as defined in claim 12 having a layer of electrical insulation material positioned between said base portion and said mounting plate.

14. A heat dissipating device for an electrical component having a flat end surface comprising a base portion held in contact with said end surface and extending outwardly from said end surface, a plurality of support members located in openings in said base portion and extending along said component to define a space for said component, a plurality of cooling fins, each having openings therein to receive said support members, and spacer means located between adjacent fins and between said base portion and the fin adjacent said base portion, said spacer means having openings for receiving said support members, and each of said fins having a central opening the inner edge of which surrounds said space.

15. A heat dissipating device as defined in claim 14 wherein each of said support members comprises fastening means for securing said spacer means and said fins to said base portion.

16. A heat dissipating device as defined in claim 15 wherein said base portion comprises a cup shaped section having a flange projecting outwardly from the open edge, said flange containing the openings for said support members and being of substantially the same configuration as said fins.

17. A heat dissipating device for a plurality of electrical components located adjacent each other, comprising a single base portion held in contact with a surface of each component and extending outwardly from said surfaces, a plurality of spaced support members extending along said components from the edge of said base portion to define a single space for said components, and a plurality of fins supported by said support members and surrounding said space for dissipating heat generated by said component, said fins being spaced apart in the extending direction of said support members to provide a passage between adjacent fins.

References Cited in the file of this patent

UNITED STATES PATENTS

| | | |
|---|---|---|
| 1,914,940 | Chilton | June 20, 1933 |
| 2,170,175 | Wiegand | Aug. 22, 1939 |
| 2,641,024 | Panagrossi | June 9, 1953 |
| 2,807,659 | Woods | Sept. 24, 1957 |
| 2,819,435 | Connell | Jan. 7, 1958 |
| 2,854,609 | Hedding | Sept. 30, 1958 |

FOREIGN PATENTS

| | | |
|---|---|---|
| 379,942 | Germany | Sept. 1, 1923 |
| 537,895 | Italy | June 9, 1956 |